United States Patent
Beyer et al.

(10) Patent No.: US 7,817,768 B2
(45) Date of Patent: Oct. 19, 2010

(54) PLL FREQUENCY GENERATOR

(75) Inventors: Sascha Beyer, Ottendorf-Okrilla (DE); Ralf Jaehne, Ottendorf-Okrilla (DE)

(73) Assignee: Atmel Automotive GmbH, Heilbronn (DE)

( * ) Notice: Subject to any disclaimer, the term of this patent is extended or adjusted under 35 U.S.C. 154(b) by 852 days.

(21) Appl. No.: 11/640,201

(22) Filed: Dec. 18, 2006

(65) Prior Publication Data
US 2007/0159260 A1 Jul. 12, 2007

(30) Foreign Application Priority Data
Dec. 17, 2005 (DE) ............... 10 2005 060 472

(51) Int. Cl.
*H03D 3/24* (2006.01)
(52) U.S. Cl. .................. 375/376; 455/76
(58) Field of Classification Search .......... 455/76; 327/105; 375/376; 398/183; 331/16, 179; 370/208; 341/143
See application file for complete search history.

(56) References Cited

U.S. PATENT DOCUMENTS

| | | | | |
|---|---|---|---|---|
| 5,563,535 | A * | 10/1996 | Corry et al. | .............. 327/105 |
| 6,064,272 | A | 5/2000 | Rhee | |
| 6,359,950 | B2 * | 3/2002 | Gossmann et al. | .......... 375/376 |
| 6,559,996 | B1 * | 5/2003 | Miyamoto et al. | .......... 398/183 |
| 6,944,121 | B1 * | 9/2005 | Weste et al. | .............. 370/208 |
| 2001/0036240 | A1 | 11/2001 | Gossmann et al. | |
| 2004/0201428 | A1 * | 10/2004 | Kenney et al. | .............. 331/16 |
| 2005/0237125 | A1 * | 10/2005 | Hino | .......................... 331/179 |
| 2005/0270202 | A1 * | 12/2005 | Haartsen | ..................... 341/143 |
| 2006/0223454 | A1 * | 10/2006 | Westwick et al. | ............. 455/76 |

FOREIGN PATENT DOCUMENTS

DE 102 57 185 B3 2/2004
WO WO 2004/088846 A1 10/2004

OTHER PUBLICATIONS

David Owen, "A New Approach to Fractional-N Synthesis," Electronic Engineering, Mar. 1, 1990, vol. 62, No. 759, Woolwich, London, GB; pp. 35-36, 38: XP000102103; ISSN: 0013-4902.

* cited by examiner

*Primary Examiner*—Edward Urban
*Assistant Examiner*—Golam Sorowar
(74) *Attorney, Agent, or Firm*—Muncy, Geissler Olds & Lowe, PLLC

(57) ABSTRACT

A PLL frequency generator is disclosed for generating an output signal with a settable target frequency, comprising a) a voltage-controlled oscillator for generating the output signal, b) a switchable frequency divider, which is connected to the voltage-controlled oscillator and is designed to derive from the output signal a frequency-divided signal whose instantaneous frequency depends on a value of an adjustable divisor, c) a switchable delay unit, which is connected to the frequency divider and is designed to generate a delayed signal in that the frequency-divided signal is delayed by delay times that depend on a control word, and d) a controller connected to the switchable delay unit controller and designed to determine the control words. According to the invention, the controller has a sigma-delta modulator and is designed to determine the control words depending on at least one signal provided by the sigma-delta modulator.

20 Claims, 2 Drawing Sheets

PLL FREQUENCY GENERATOR

This nonprovisional application claims priority under 35 U.S.C. §119(a) on German Patent Application No. DE 102005060472, which was filed in Germany on Dec. 17, 2005, and which is herein incorporated by reference.

BACKGROUND OF THE INVENTION

1. Field of the Invention

The present invention relates to a PLL frequency generator (phase-locked loop). The invention relates furthermore to a transmitting/receiving device and to an integrated circuit with a PLL frequency generator of this type.

2. Description of the Background Art

The invention falls within the field of telecommunications. It falls particularly within the field of PLL frequency generators, with whose help transmitting/receiving devices in telecommunication systems access spectrally spaced carrier frequency channels. Such PLL frequency generators derive an output signal with a settable target frequency from a highly precise reference signal and provide it as a local oscillator signal for receiver-side down-mixing of the incoming signal and/or for transmitter-side up-mixing. The settable target frequency can be selected hereby from a group of predefined target frequency values, the so-called frequency raster.

If the target frequency values each correspond to an integer multiple of the frequency of the reference signal ("reference frequency"), the frequency of the output signal can be divided in the feedback branch of the frequency generator by an integer divisor. Because of phase jitter, at the target frequency, the spectrum of the output signal of such an "integer-N" PLL frequency generator has a surrounding interference part, which determines the signal/noise ratio of the output signal, in addition to the desired spectral line.

However, if, for example, the minimum spacing between two neighboring target frequency values is smaller than the reference frequency, a frequency division by a non-integer divisor is necessary in the feedback branch of the frequency generator. Frequency divisions of this type are typically effected by switchable frequency dividers (multi-modulus divider, MMD), which in each case at times perform frequency divisions by different integer divisor values, in order to achieve the necessary non-integer frequency division within a time average. The switching between different integer divisor values, however, causes an additional time-variant periodic phase error in the frequency-divided signal and thereby another interference part in the spectrum of the output signal in the form of spectral lines. Without further measures to compensate for the additional phase error, the output signal of this type of "fractional-N" PLL frequency generator, therefore, has a lower signal/noise ratio than a corresponding integer-N PLL frequency generator or a fractional-N PLL frequency generator operated in the integer mode. On the receiver side, such spectral lines lead to undesirable secondary headends.

U.S. Pat. No. 6,064,272 discloses a fractional-N PLL frequency generator, which has a phase compensation circuit, connected downstream to the switchable frequency divider, in the feedback branch. This phase compensation circuit with use of delay lines containing a variable plurality of delay elements provides a total of four different delayed variants of the frequency-divided signal, from which one is selected by a control circuit, which is controlled by an accumulator. Furthermore, a tuning circuit ("on-chip tuning circuit") is provided with additional delay elements, which generate a control voltage for the delay elements.

A disadvantage here is that the interfering part, caused by the fractional-N division, in the spectrum of the output signal is insufficiently suppressed and therefore the signal/noise ratio is relatively small. Additional interference parts result from the switching between delay lines. It is a disadvantage, furthermore, that the realization cost and the energy consumption of the phase compensation circuit and the tuning circuit at higher frequency resolutions (spacing between two neighboring target frequency values considerably smaller than the reference frequency) and/or at higher target frequency values, for example, in the GHz range increase drastically, and implementation of the frequency generator is therefore uneconomic or virtually no longer possible.

SUMMARY OF THE INVENTION

It is therefore an object of the present invention to provide a PLL frequency generator, which achieves a high signal/noise ratio and is simple to implement and energy-efficient to operate also at higher frequency resolutions and/or higher target frequency values, so that powerful transmitting/receiving devices can be implemented simply, cost effectively, and energy efficiently.

The PLL frequency generator of the invention for generating an output signal with a settable target frequency has the following units: a) a voltage-controlled oscillator for generating the output signal, b) a switchable frequency divider, which is connected to the voltage-controlled oscillator and is designed to derive from the output signal a frequency-divided signal whose instantaneous frequency depends on a value of an adjustable divisor, c) a switchable delay unit, which is connected to the frequency divider and is designed to generate a delayed signal by delaying the frequency-divided signal by delay times that depend in each case on a control word, and d) a controller which is connected to the switchable delay unit and is designed to determine the control words, whereby the controller has a sigma-delta modulator and is designed to determine the control words depending on at least one signal provided by the sigma-delta modulator.

The transmitting/receiving device of the invention and the integrated circuit of the invention each have this type of PLL frequency generator.

A sigma-delta modulator is provided to determine the control words depending on at least one signal provided by the sigma-delta modulator. A high signal/noise ratio is achieved by this means and the additional phase error, caused by the fractional-N division, is also instantaneously compensated and with the saving of effort and operating energy also at higher frequency resolutions and/or higher target frequency values and/or nonlinearities of the delay unit. The downstream phase detector therefore "sees" only the remaining "integer-N" phase error, so that with the help of the invention the advantages of integer-N frequency generators (low phase jitter, high signal/noise ratio) can be combined with those of fractional-N frequency generators (high frequency resolution). For this reason, it is possible to realize powerful integrated circuits and thereby also powerful transmitting/receiving devices simply, cost-effectively, and energy-efficiently.

In an embodiment, the controller is connected to the frequency divider and designed to determine the values of the adjustable divisor depending on at least one signal provided by the sigma-delta modulator. Because both the control words and the divisor are generated depending on one or more signals provided by the sigma-delta modulator, the implementation effort is simplified and the energy consumption is reduced.

In another embodiment, the sigma-delta modulator has an accumulator, which is designed to accumulate an input signal from the sigma-delta modulator and to provide an accumulated signal, depending on which the controller determines the control words. This embodiment is simple to realize.

The accumulator provides an overflow signal, depending on which the controller determines the values of the adjustable divisor. Both the control words and the divisor are thereby derived from parameters provided by the accumulator. This enables simple and energy-efficient implementations.

In an embodiment, the controller has a first-order sigma-delta modulator and is designed to determine the control words in such a way that each control word agrees with a value of the accumulated signal. This embodiment is especially simple to realize and especially energy-efficient to operate.

In an embodiment, the controller has a sigma-delta modulator of the second or higher order, which is designed to provide a first overflow signal and a second overflow signal, depending on which the controller determines the control words. Because of an especially effective suppression of the interference spectrum spectral lines lying relatively close to the target frequency, this embodiment has an especially high efficiency (high signal/noise ratio) with a simple implementability and a low energy consumption.

The controller determines the control words depending on a first differential signal from the first overflow signal and the second overflow signal.

In another embodiment, the controller determines the control words depending on a second differential signal from the accumulated signal and the first differential signal. Advantageously, the controller is designed to store values of the second differential signal in the accumulator.

Each control word, except for an offset value, agrees with one value each of the second differential signal. Addition of the constant offset value to the values of the second differential signal achieves that all control words involve positive delay times.

In an embodiment, the controller, to determine the control words, has a determination unit, connected to the sigma-delta modulator and the switchable delay unit, with at least one adder/subtractor. This enables an especially simple implementation.

In an embodiment, the sigma-delta modulator has an order of two. This embodiment has a high efficiency with a very simple implementability and a very low energy consumption.

In another embodiment, the controller is designed to provide the control words depending on the delayed signal. This enables the delay unit at especially advantageous times to switch to the new delay time, corresponding to the actual control word, so that the additional phase error, introduced by the fractional-N division, is compensated especially precisely.

In another embodiment, the controller is designed to provide the control words in synchrony in each case with an edge of the delayed signal, e.g., with a rising or a falling edge. As a result, an optimal compensation of the additional phase error and therefore a maximum signal/noise ratio are achieved.

To provide the control words, the controller has a latch clocked by the delayed signal. This results in an especially effort-saving realization.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
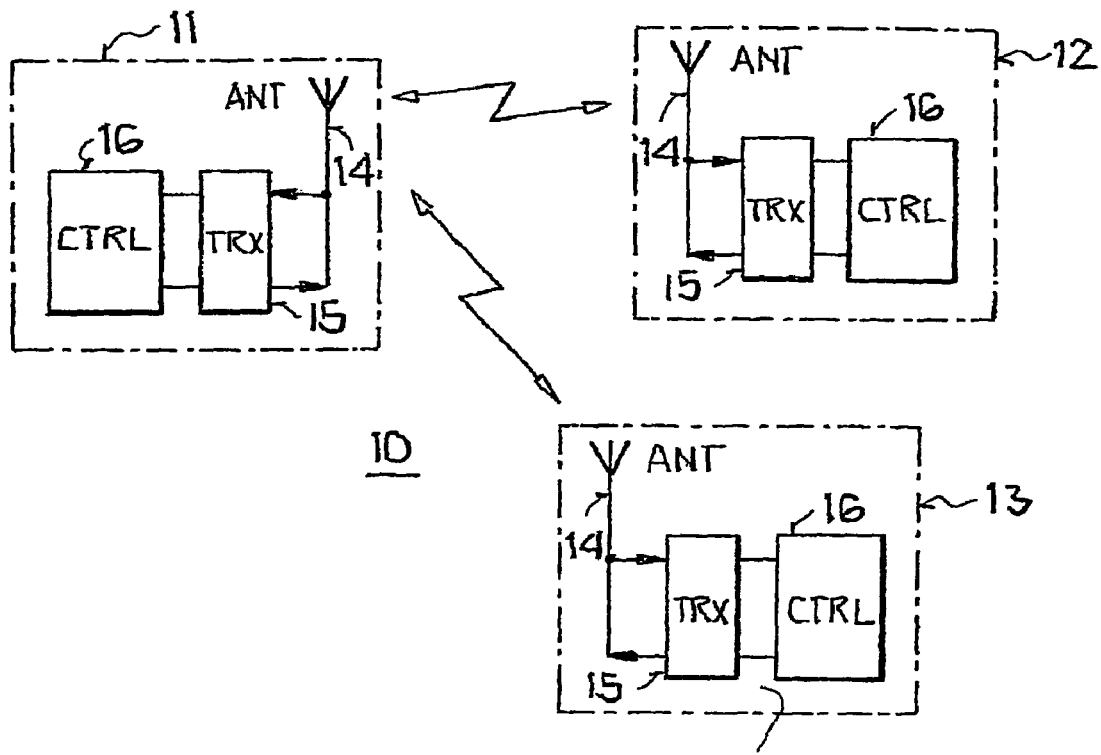
FIG. 1 illustrates an example of a "Wireless Personal Area Network" (WPAN) according to the IEEE Standard 802.15.4 with transmitting/receiving devices of the invention.

In the figures, the same and functionally identical elements and signals, if not specified otherwise, are provided with the same reference characters.

So-called "Wireless Personal Area Networks" (WPANS) may be used for the wireless transmission of information over relatively short distances. FIG. 1 shows an example of a WPAN 10 according to the standard IEEE 802.15.4. This standard specifies low-rate WPANs, which with raw data rates up to a maximum of 250 kbit/s and stationary or mobile devices are suitable for applications in industrial monitoring and control, in sensor networks, in automation, and in the field of computer peripherals and for interactive games. In addition to a very simple and cost-effective implementability of the devices, an extremely low power requirement of the device is of critical importance for such applications. Thus, an objective of this standard is a battery life of several months to several years.

The WPAN, shown in FIG. 1, comprises three transmitting/receiving devices 11-13 in the form of stationary or mobile devices, which exchange information in a wireless manner by means of radio signals. Transmitting/receiving device 11 is a so-called full-function device, which takes on the function of the WPAN coordinator, whereas transmitting/receiving devices 12, 13 are so-called reduced-function devices, which are assigned to full-function device 11 and can only exchange data with said device. Apart from the star network topology depicted in FIG. 1, in which bidirectional data transmission can only occur between one of the reduced-function devices 12, 13 and full-function device 11, but not between the reduced function devices 12, 13, the standard also provides for so-called "peer-to-peer" topologies, in which all full-function devices can communicate with all other full-function devices.

Transmitting/receiving devices 11-13 each comprise an antenna 14, a transmitting/receiving unit (transceiver, TRX) 15, connected to the antenna, for transmitting and receiving data according to IEEE 802.15.4, and a control unit (CTRL) 16, connected to the transmitting/receiving unit, to control transmitting/receiving unit 15 according to IEEE 802.15.4. Furthermore, transmitting/receiving devices 11-13 each contain a power supply unit, not shown in FIG. 1, in the form of a battery, etc., to supply power to units 15, 16, and possibly other components (sensors, actuators, etc.).

It will be assumed in the following text that the data transmission occurs in the license-free 2.4-GHz ISM band (industrial, scientific, medical). The IEEE standard 802.15.4 provides a total of 16 channels at a spacing of 5 MHz each in this frequency band. In these channels, a band spreading (spreading) with a chip rate of fc=2 Mchip/s and an offset QPSK modulation (quaternary phase shift keying) are specified for raw data rates of fB=250 kbit/s.

The transmitting unit of each transmitting/receiving unit 15 converts the data stream, to be transmitted in each case, into a radio signal to be emitted via its antenna 14 by first transforming the data stream to be transmitted according to IEEE 802.15.4 into 4 bit wide symbols and these into successive PN sequence (pseudo noise) of 32 chips each. The chips of the successive PN sequences are then offset-QPSK-modulated (quaternary phase shift keying), spectrally shifted into 1 of the 16 channels in the ISM frequency band with the use of a PLL frequency generator of the invention, and finally amplified for the transmission. Because an offset QPSK modulation with half-sinus pulse formation corresponds to an MSK modulation (minimum shift keying), i.e., an FSK modulation (frequency shift keying) with a modulation index of ½ or frequency deviation ΔF =fC/4=0.5 MHz, the PLL frequency generator within the scope of a direct frequency modulation can also take into account the frequency offset necessary for this by means of the modulation signal.

The receiving unit of each transmitting/receiving unit 15 converts a radio signal, received by its antenna 14 and generated by the transmitting unit of another transmitting/receiving device according to IEEE 802.15.4, as error free as possible into the transmitted data, in that the received radio signal is amplified, shifted spectrally into the baseband or into an intermediate frequency range with use of the aforementioned PLL frequency generator, and then demodulated, and finally the data are detected.

Transmitting/receiving unit 15 can be a part of an integrated circuit (not shown in FIG. 1), e.g., an ASIC (application specific integrated circuit) or an ASSP (application specific standard product), whereas control unit 16 can be a microcontroller (also not shown). Advantageously, each transmitting/receiving device can have only one integrated circuit (e.g., designed as ASIC or ASSP), which senses the functions of its transmitting/receiving unit 15 and its control unit 16.

Figure 2:
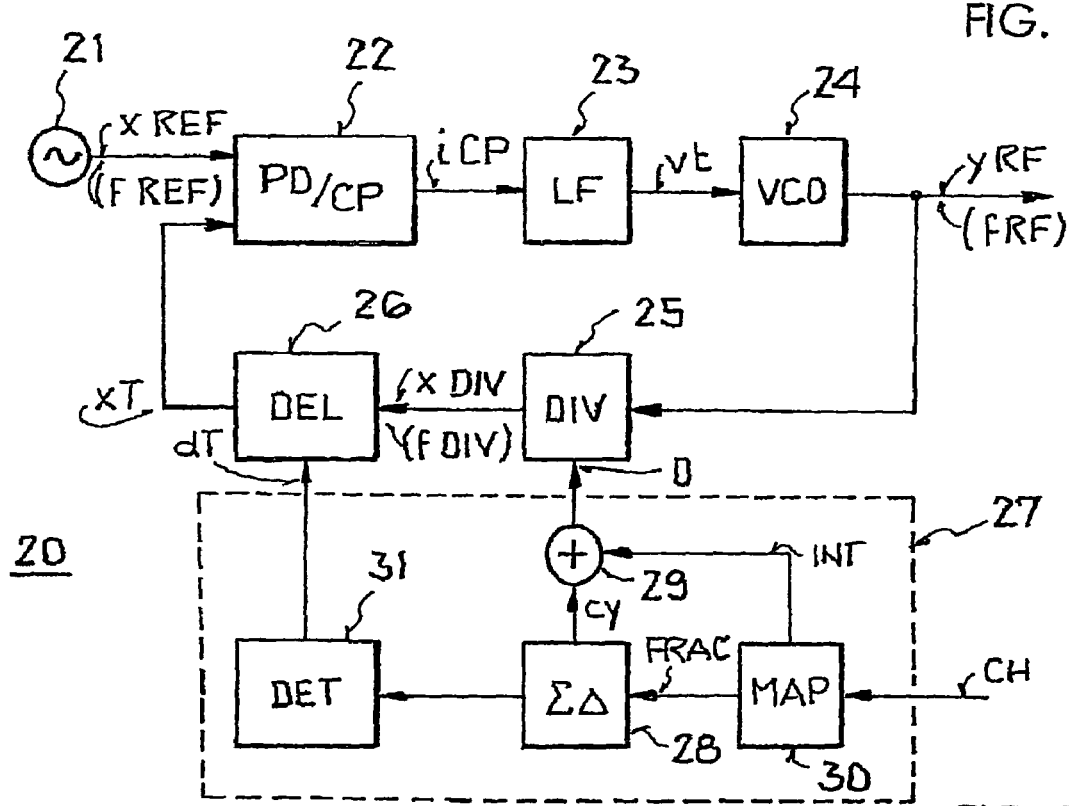
FIG. 2 illustrates a PLL frequency generators of the invention according to an embodiment of the present invention.

FIG. 2 shows a block diagram of a PLL frequency generator of the invention for a transmitting/receiving unit 15 of FIG. 1. PLL frequency generator 20 has a reference oscillator 21, a phase (difference) detector/charge pump (PD/CP) 22, a loop filter (LF) 23, a voltage-controlled oscillator (VCO) 24, a switchable frequency divider (DIV) 25, a switchable delay unit (DEL) 26, and a controller 27.

Reference oscillator 21 generates an optionally amplified reference signal xREF with a reference frequency fREF and is made, e.g., as a quartz oscillator or as a voltage-controlled quartz oscillator.

PD/CP unit 22 (phase (difference) detector/charge pump) has a first input, connected to reference oscillator 21, and a second input, connected to the output of delay unit 26. PD/CP unit determines the phase deviation (phase difference) between the reference signal xREF, applied at the first input, and the delayed signal xT, applied at the second input, and provides a defined current iCP at its output depending on the phase deviation. A phase frequency detector can also be provided instead of the phase detector.

Loop filter (LF) 23 has an input, connected to PD/CP unit 22, and an output, connected to VCO 24. Depending on the current iCP, applied at the input, loop filter 23 generates a control voltage vt and provides this at its output.

Voltage-controlled oscillator (VCO) 24 has an input, connected to loop filter 23, and an output, connected to frequency divider 25. Depending on the control voltage vt applied at the input, VCO 24 generates an optionally additionally amplified output signal yRF with a settable target frequency fRF dependent, e.g., on a channel index CH, and provides it at its output. The slope of the frequency/control voltage characteristic of VCO 24 is, for example, 40 MHz/V.

Switchable frequency divider (DIV) 25 has a signal input, connected to VCO 24, and a control input, connected to controller 27. From the VCO output signal yRF applied at its signal input, frequency divider 25 derives a frequency-divided signal xDIV, whose instantaneous frequency fDIV according to fDIV=fRF/D depends on the actual value of the adjustable divisor D, applied at its control input, and provides the frequency-divided signal xDIV at its output.

The value, which the divisor assumes, depends on the settable target frequency fRF or the corresponding channel index CH and on the reference frequency fREF of the reference signal xREF. If, for example, the difference between the target frequencies of two spectrally adjacent channels, i.e., the channel raster, is smaller than the reference frequency fREF (in this case, this is referred to as a "fine" frequency resolution), the divisor assumes a non-integer value at least for some target frequencies. In the exemplary case of a reference frequency of fREF=16 MHz, according to IEEE 802.15.4, the divisor value fRF/fREF=150.3125 results, for example, for the lowest target frequency (fRF=2405 MHz) in the ISM band.

To realize such non-integer divisor values, frequency divider 25 is made switchable, whereby at times it performs frequency divisions with different integer divisor values D in such a way that the required non-integer divisor value results "on average" considered over a certain time interval. Frequency generators with such a switchable frequency divider are called fractional-N PLL frequency generators.

The variation of the values of the divisor D causes a time-variant phase error between the frequency-divided signal xDIV and the reference signal xREF, which modulates the VCO output signal yRF via loop filter 23 ("interference modulation"). In addition to the interference part due to phase noise, which is also present in integer-N PLL frequency generators, the spectrum of the VCO output signal yRF in fractional-N PLL frequency generators due to this time-variant periodic phase error has another interference part in the form of spectral lines around the target frequency fRF, which depends on the non-integer part of the non-integer divisor value to be realized on average. These spectral lines are largely suppressed according to the invention.

Frequency divider 25 can be realized as a so-called multi-modulus divider (MMD), i.e., as a digital counter programmable within the count range. Advantageously, the MMD consists of two frequency dividers, whereby the first is also called a prescaler and is designed to undertake frequency divisions by N or N+1 and the second works with a typically fixed divisor ratio and controls the modulus input of the prescaler depending on the divisor D applied at the control input.

Switchable delay unit (DEL) 26 has a signal input, connected to frequency divider 25, and a control input, connected to controller 27. Delay unit 26 creates a delayed signal xT, in that the frequency-divided signal XDIV, applied at its signal input, is delayed by delay times ΔT, each of which depend on digital control word dT, applied at its control input, and provides the delayed signal xT at its output. The delay time ΔT depends hereby substantially linearly on the corresponding control word dT $$\Delta T = t0 + dT * ts, \quad (1)$$

where t0 designates a basic delay of, e.g., about 1 ns and ts the delay increment dependent on the frequency resolution. At an exemplary width of the control words of 7 bits, it is possible to set a total of 128 different delay times ΔT with each control word dT. Within delay unit 26, which is preferably realized on the basis of a CMOS buffer, the control word dT is converted into a current or a voltage, which sets the respective delay time ΔT. The control words dT are determined and provided by controller 27 in such a way that the resulting delay times ΔT are suitable for instantaneously compensating the time-variant phase error explained above.

Controller 27 has an input for supplying a parameter determining the target frequency fRF, such, as e.g., a channel index CH. Depending on the channel index CH, controller 27 determines the control words dT and provides them at its first output, connected to the control input of delay unit 26. Preferably, controller 27 determines in addition the values of the adjustable divisor D depending on the channel index CH and provides them at its second output, connected to the control input of frequency divider 25.

Controller 27 has a sigma-delta modulator (ΣΔ) 28, an adder 29, a mapping unit (MAP) 30, and a determination unit (DET) 31 for determining the control words dT. The channel index CH is supplied to mapping unit 30 on the input side. On the output side, the mapping unit is connected to sigma-delta modulator 28 and a first input of adder 29. On the input side, at its second input adder 29 is connected to sigma-delta modulator 28 and on the output side via the second output of controller 27 to frequency divider 25. Sigma-delta modulator 28 is connected on the input side to mapping unit 30 and on the output side to the second input of adder 29 and to dT determination unit 31. dT determination unit 31 is connected on the input side to sigma-delta modulator 28 and on the output side via the first output of controller 27 to switchable delay unit 26.

Mapping unit 30 derives the values INT and FRAC from the channel index CH. The values INT and FRAC hereby together indicate the factor by which the reference frequency fREF must be multiplied to achieve the desired target frequency fRF with consideration of the channel indexes CH. The values INT and FRAC are determined such that the following equation applies:

$$(INT + FRAC/RES) * fREF = fRF. \quad (2)$$

The parameter RES hereby determines the frequency resolution of the frequency generator. The higher the value of the parameter RES, the higher the frequency resolution that is achieved, i.e., the finer the frequency raster or the closer together the settable target frequencies. With the exemplary values RES=32 and fREF =16 MHz, e.g., target frequencies can be set at a spacing of fREF/RES=0.5 MHz, which corresponds to a high frequency resolution compared with the reference frequency fREF. The parameter FRAC in this case assumes a value between zero and RES−1=31 and can therefore be represented by a 5 bit wide word. The increment ts of the delay times ΔT to be set by the delay unit 26 according to equation (1) is advantageously $$ts = 1/(fRF * RES) \approx 0.012 \text{ ns}.$$

If PLL frequency generator 20 is used transmitter-side for direct frequency modulation, mapping unit 30 is supplied in addition with the modulation signal (not shown in the figures). Depending on the values of the modulation signal, now optionally changed target frequency values fRF result and thereby FRAC/INT values changed according to equation (2). Thereby, the values of divisor D and the control words dT also depend on the modulation signal. In the case of the aforementioned exemplary values and a two-step modulation signal with a frequency deviation of ΔF=0.5 MHz, generally only the FRAC value changes by ±1 depending on the actual value of the modulation signal. The modulation signal can be supplied in addition to a loop filter made switchable to achieve a more rapid transient oscillation.

Sigma-delta modulator 28, to which the FRAC value is supplied, in the simplest case of a first-order sigma-delta modulator (M=1), determines a sequence cy of binary values (zeros and ones), whose relative frequency reflects the value FRAC/RES. With the aforementioned exemplary values of RES and fREF, for example, the value FRAC=16, which according to equation (2) stands for a frequency offset of 16*fREF/RES=16*0.5 MHz=8 MHz, leads to a sequence cy of zero and one values, whose numbers match. By analogy hereto, the FRAC values 0 or 31 lead to a sequence cy of zero values according to a vanishing frequency offset or to a sequence cy of one values according to a frequency offset of 31*0.5 MHz=15.5 MHz.

Instead of two-step sequences with binary values, with use of a sigma-delta modulator of the order of two or higher (M≧2), higher-step sequences cy, e.g., with integer values between −1 and 2 (for M=2) can also be generated. In a first embodiment of the PLL frequency generator 20 of the invention, which will be described in greater detail hereafter with reference to FIG. 3, sigma-delta modulator 28 has an order of M≧2, and in a second embodiment, which will be described in detail hereafter with reference to FIG. 4, an order of M=1. The output signal of sigma-delta modulator 28 is designated in both cases as a first overflow signal cy.

In adder 29, the cy values, generated by sigma-delta modulator 28, are finally added to an INT value and the summed values INT+cy are supplied as time-variant divisor D to switchable frequency divider 25. With use of this time-variant divisor D, which corresponds in the time average to the factor INT+FRAC/RES from equation (2), frequency divider 25 realizes the necessary frequency division.

The frequency division by a time-variant divisor D=INT+cy causes an additional time-variant phase error, which is instantaneously compensated by switchable delay unit 26, in that controller 27 determines the control words dT according to the invention and supplies them to the control input of delay unit 26. The control words dT depend on at least one signal provided by sigma-delta modulator 28. The signal or signals being dealt with here will be described in greater detail hereafter with reference to FIGS. 3 and 4.

With use of the sigma-delta modulator, spectral lines lying relatively close to the target frequency in the interference part of the spectrum of the VCO output signal can be suppressed very effectively, so that an especially high signal/noise ratio results in the useful frequency range. In addition, the sigma-delta modulator suppresses interferences, which are caused by possible nonlinearities of delay unit 26, which is particularly advantageous when the ratio FRAC/RES has a value close to zero or one.

Figure 3:
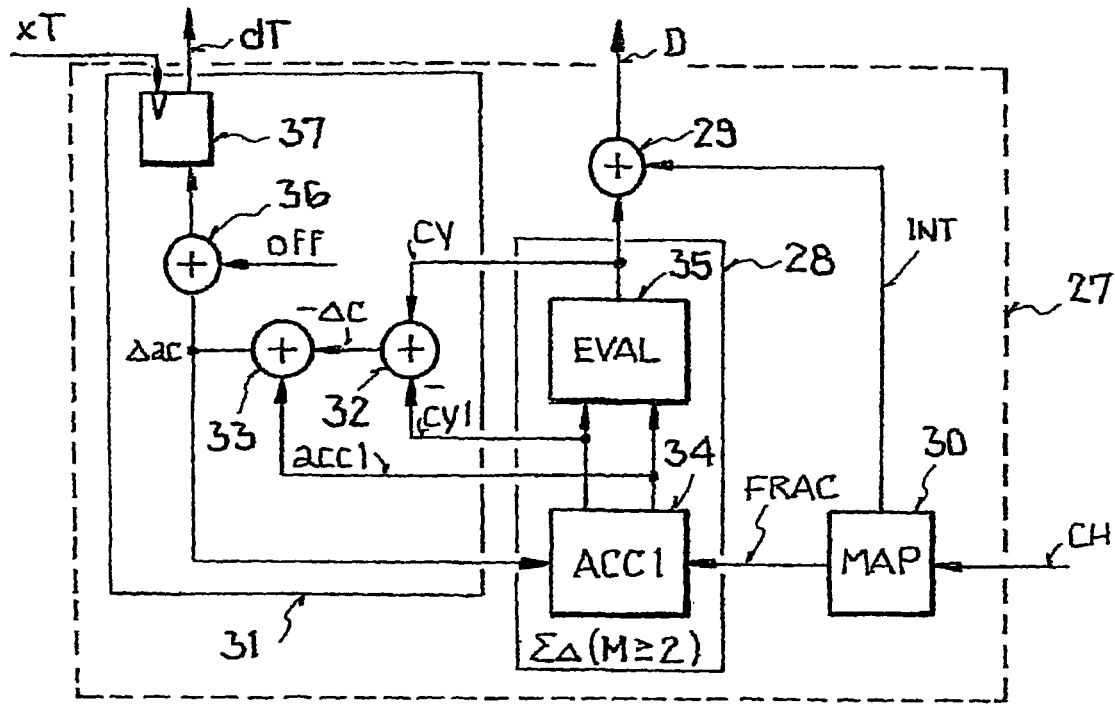
FIG. 3 illustrates a controller according to an embodiment.

FIG. 3 shows a block diagram of a controller 27 of the first exemplary embodiment of a PLL frequency generator of the invention. The sigma-delta modulator, the adder, the mapping unit, and the dT determination unit in FIG. 3 are again labeled with the reference characters 28-31. In FIG. 3, sigma-delta modulator 28 has an order of two or higher (M≧2).

Sigma-delta modulator 28 has an input-side accumulator (ACC1) 34 and a downstream evaluation unit (EVAL) 35. The, for example, 5 bit wide accumulator 34 accumulates the values of the input signal FRAC of the sigma-delta modulator and provides accumulated values in an accumulated signal acc1 and "carry" values, indicating an overflow, in a second overflow signal cy1. Evaluation unit 35 derives the first overflow signal cy from the accumulated signal acc1 and the second overflow signal cy1 and provides it as an output signal of the sigma-delta modulator to both adder 29 and dT determination unit 31. Depending on the order of the sigma-delta modulator, the evaluation unit contains a number of other accumulators and additional logic/combinatorics. The output signal cy of the sigma-delta modulator corresponds hereby to a combination of the overflow signals from different accumulators.

The calculation of the control words is based on the following insights: The change in the time-variant phase error over time is proportional to the change in the content of accumulator 34. Therefore, the instantaneous file and the actual accumulator content are to be used for determining the control words dT.

dT determination unit 31 has the following units connected in series: a first adder/subtractor 32, a second adder/subtractor 33, a third adder/subtractor 36, and a latch 37. First adder/subtractor 32, connected on the input-side to accumulator 34 and to evaluation unit 35 of sigma-delta modulator 28, subtracts the values of the second overflow signal cy1 from the values of the first overflow signal cy and at its output provides the first differential signal $\Delta c = cy - cy1$. Second adder/subtractor 33, connected on the input-side to accumulator 34 and to first adder/subtractor 32, subtracts the values of the first differential signal $\Delta c$ from the values of the accumulated signal acc1 and at its output provides the second differential signal $$\Delta ac = acc1 - \Delta c = acc1 - (cy - cy1) = acc1 - cy + cy1. \quad (3)$$

Instead of the two adders/subtractors 32, 33, each with two inputs, a single adder/subtractor with three inputs for the signal cy, cy1, and acc1 can be provided to calculate the $\Delta ac$ values.

The $\Delta ac$ values are both stored in accumulator 34 and used to determine the control words dT. Third adder/subtractor 36, connected on the input-side to second adder/subtractor 33, adds a constant positive offset 'off' to the $\Delta ac$ values and at its output provides the summed values $\Delta ac + off$. This makes sure that all control words dT also correspond to positive delay times $\Delta T$, when one or more of the $\Delta ac$ values without offset correction would lead to a negative delay time $\Delta T$. The summed values $\Delta ac + off$ are finally supplied to latch 37, connected on the input-side to third adder/subtractor 36, said latch which provides the control words dT (bit width, e.g., 7 bits) at its output and is preferably clocked with the delayed signal xT. In this way, the control words dT are provided synchronously each time with an edge of the delayed signal xT, e.g., with a rising edge of xT in each case. As a result, an optimal instantaneous correction of the time-variant phase error is made possible. Alternatively, latch 37 can be clocked with the frequency-divided signal xDIV.

Controller 27, shown in FIG. 3, therefore determines the control words dT depending on the accumulated signal acc1 and from the overflow signals cy, cy1 (or their differential signal $\Delta c$), i.e., depending on a total of three signals provided by the sigma-delta modulator, and provides the control words dT to delay unit 26 (see FIG. 2). As already described with reference to FIG. 2, controller 27 determines, apart from control words dT, preferably also the values of the adjustable divisor D depending on at least one signal provided by the sigma-delta modulator, namely, the overflow signal cy or the accumulated signal acc1 and the overflow signal cy1.

The first exemplary embodiment of a PLL frequency generator of the invention, as described with reference to FIGS. 2 and 3, because of an especially effective suppression of the interference spectrum spectral lines lying relatively close to the target frequency, has an especially high efficiency (high signal/noise ratio) with a simple implementability and a low energy consumption.

In an especially advantageous embodiment, the sigma-delta modulator 28 has an order of two (M=2). This embodiment has a high efficiency with a very simple implementability and very low energy consumption. Simulations performed by the applicant and confirmed by measurements have shown that the interference modulations in this case are suppressed by over 30 dB.

Figure 4:
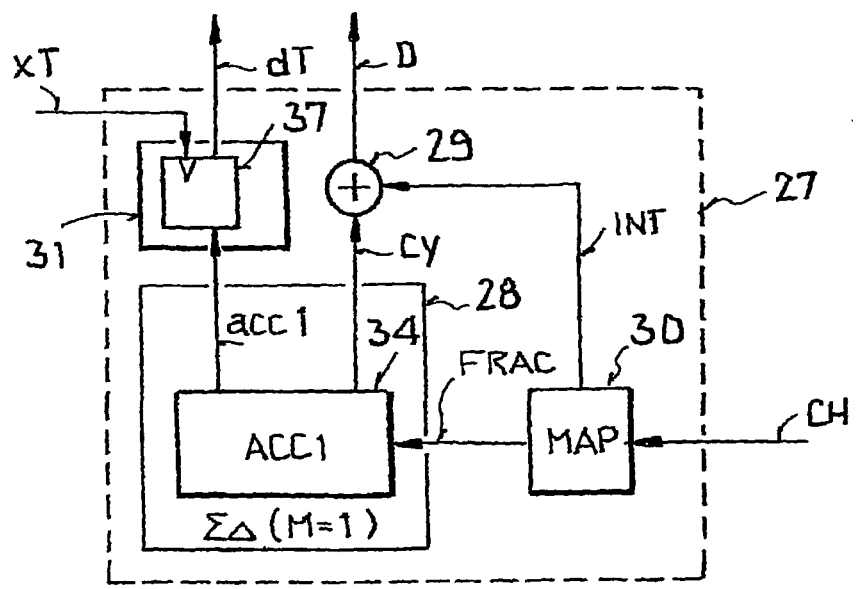
FIG. 4 illustrates a controller according to a second embodiment.

FIG. 4 shows a block diagram of a controller 27 of the second embodiment of a PLL frequency generator of the invention. The sigma-delta modulator, the adder, the mapping unit, the dT determination unit, the accumulator, and the latch in FIG. 4 are again designated by the reference characters 28-31, 34, and 37, respectively. In FIG. 4, sigma-delta modulator 28 has an order of one (M=1).

In the case of a first-order sigma-delta modulator, the first overflow signal cy agrees with the second overflow signal cy1 according to FIG. 3, so that evaluation unit 35 of FIG. 3 is eliminated and the, for example, 5 bit wide accumulator 34 according to FIG. 4 provides, in addition to the accumulated signal acc1, now also directly the output signal cy of sigma-delta modulator 28. With agreeing overflow signals cy, cy1, furthermore, a vanishing first differential signal $\Delta c = cy - cy1 = 0$ results, so that in FIG. 4 the first and second adder/subtractor 32, 33 of FIG. 3 are eliminated. Because the values of the accumulated signal acc1 cannot lead to negative delay times $\Delta T$ per se, third adder/subtractor 36 of FIG. 3 is also eliminated, so that each control word dT results directly from the corresponding value of the accumulated signal acc1 or the actual content of accumulator 34. The accumulator with its content (acc1) therefore directly represents the instantaneous phase error due to the fractional-N division and with its overflow signal the slope of the phase error.

Determination unit 31 thereby has only one latch 37 connected on the input-side to accumulator 34 and preferably clocked with the delayed signal xT. Latch 37, to which the accumulated signal acc1 is supplied, provides the control words dT (bit width, e.g., 5 bits) at its output. In this way, the control words dT are preferably provided synchronously each time with an edge of the delayed signal xT, e.g., each with a rising edge of xT. As a result, an optimal instantaneous correction of the time-variant phase error is made possible. Alternatively, latch 37 can be clocked with the frequency-divided signal XDIV.

Controller 27 thereby determines the control words dT depending on only one signal provided by the sigma-delta modulator, namely, the accumulated signal acc1 and provides the control words dT to delay unit 26 (see FIG. 2). The values of the control words dT hereby agree in each case directly with a value of the accumulated signal acc1. Preferably, the values of the adjustable divisor D of controller 27 of FIG. 4 are also determined depending on at least one signal provided by sigma-delta modulator 28, namely, the overflow signal (output signal) cy.

It is evident from FIG. 4 that for the present invention one accumulator (34), which is usually required in any event to determine the divisor values, is sufficient in the simplest case to determine the values of the control words dT.

The second embodiment of a PLL frequency generator of the invention, described with reference to FIGS. 2 and 4, is especially simple to implement and especially energy-efficient in operation.

Although the present invention was described above with reference to exemplary embodiments, it is not limited thereto but can be modified in many ways. Thus, the invention is not limited, for example, to WPANs per se or to WPANs according to IEEE 802.15.4, or to the frequency bands, target frequency values, spectral masks, etc., specified therein. The invention is also not limited to a specific reference frequency, frequency resolution, a specific architecture, or a specific order of the sigma-delta modulator, or a specific architecture of the PLL, the delay unit, the frequency divider, or the controller. Rather, the invention can be used advantageously in highly diverse wireless or hard-wired communication systems.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A phase locked loop frequency generator for generating an output signal with a settable target frequency, the phase locked loop frequency generator comprising:
    a voltage-controlled oscillator for generating the output signal;
    a switchable frequency divider connected to the voltage-controlled oscillator for deriving a frequency-divided signal whose instantaneous frequency is based on a value of an adjustable divisor from the output signal;
    a switchable delay unit connected to the frequency divider for generating a delayed signal by delaying the frequency-divided signal by delay times that are based on a control word; and
    a controller connected to the switchable delay unit for determining the control words, the controller having a sigma-delta modulator and determines the control words based on at least one signal provided by the sigma-delta modulator, said controller including an input for receiving a parameter determining said target frequency for said output signal, wherein the sigma-delta modulator includes an accumulator, which accumulates an input signal of the sigma-delta modulator and provides an accumulated signal, and wherein the controller determines the control words based on the accumulated signal.

2. The phase locked loop frequency generator according to claim 1, wherein the controller is connected to the frequency divider and determines values of the adjustable divisor based on at least one signal provided by the sigma-delta modulator.

3. The phase locked loop frequency generator according to claim 1, wherein the accumulator provides an overflow signal, and wherein the controller determines the values of the adjustable divisor depending on an overflow signal.

4. The phase locked loop frequency generator according to claim 1, wherein the controller has a first-order sigma-delta modulator and determines the control words in so that each control word agrees with a value of the accumulated signal.

5. The phase locked loop frequency generator according to claim 1, wherein the controller has a sigma-delta modulator of a second or higher order, which provides a first overflow signal and a second overflow signal, and wherein the controller determines the control words based on the first and second overflow signals.

6. The phase locked loop frequency generator according to claim 5, wherein the controller determines the control words based on a first differential signal from the first overflow signal and the second overflow signal.

7. The phase locked loop frequency generator according to claim 6, wherein the controller determines the control words based on a second differential signal from the accumulated signal and the first differential signal.

8. The phase locked loop frequency generator according to claim 7, wherein the controller stores the values of the second differential signal in the accumulator.

9. The phase locked loop frequency generator according to claim 7, wherein each control word, except for an offset value, agrees with one value each of the second differential signal.

10. The phase locked loop frequency generator according to claim 5, wherein the controller, to determine the control words, has a determination unit connected to the sigma-delta modulator and the switchable delay unit, and includes at least one adder/subtractor.

11. The phase locked loop frequency generator according to claim 5, wherein a second-order sigma-delta modulator is provided.

12. The phase locked loop frequency generator according to claim 1, wherein the controller provides the control words based on the delayed signal.

13. The phase locked loop frequency generator according to claim 12, wherein the controller provides the control words in synchrony in each case with an edge of the delayed signal.

14. The phase locked loop frequency generator according to claim 12, wherein the controller, to provide the control words, has a latch clocked by the delayed signal.

15. The phase locked loop frequency generator according to claim 1, wherein the voltage-controlled oscillator generates the output signal based on a control voltage, and wherein the phase locked loop frequency generator has a phase detector, which is connected to the switchable delay unit and determines the phase difference between a reference signal and the delayed signal and provides it for the generation of the control voltage.

16. The phase locked loop frequency generator according to claim 15, wherein a loop filter is provided that is connected to the phase detector and the voltage-controlled oscillator for generating the control voltage.

17. A transmitting/receiving device for a data transmission system comprising:
    an antenna;
    transmitting/receiving unit connected to the antenna for transmitting and receiving data; and
    a phase locked loop frequency generator comprising:
        a voltage-controlled oscillator for generating the output signal;
        a switchable frequency divider connected to the voltage-controlled oscillator for deriving a frequency-divided signal whose instantaneous frequency is based on a value of an adjustable divisor from the output signal;
        a switchable delay unit connected to the frequency divider for generating a delayed signal by delaying the frequency-divided signal by delay times that are based on a control word; and
        a controller connected to the switchable delay unit for determining the control words, the controller having a sigma-delta modulator and determines the control words based on at least one signal provided by the sigma-delta modulator, said controller including an input for receiving a parameter determining said target frequency for said output signal, wherein the sigma-delta modulator includes an accumulator, which accumulates an input signal of the sigma-delta modulator and provides an accumulated signal, and wherein the controller determines the control words based on the accumulated signal.

18. The transmitting/receiving device according to claim 17, wherein the phase locked loop frequency generator is an integrated circuit.

19. The transmitting/receiving device according to claim 17, wherein transmission and receiving of data is based on IEEE standard 802.15.4.

20. A phase locked loop frequency generator for generating an output signal with a settable target frequency, the phase locked loop frequency generator comprising:
  a voltage-controlled oscillator configured to generate the output signal;
  a switchable frequency divider connectable to the voltage-controlled oscillator and configured to derive a frequency-divided signal whose instantaneous frequency is based on a value of an adjustable divisor from the output signal;
  a switchable delay unit connectable to the frequency divider and configured to generate a delayed signal by delaying the frequency-divided signal by delay times that are based on a control word; and
  a controller having a sigma-delta modulator, the controller being connectable to the switchable delay unit and configured to determine the control word based on at least one signal provided by the sigma-delta modulator,
  wherein the sigma-delta modulator includes an accumulator configured to accumulate an input signal of the sigma-delta modulator and configured to provide an accumulated signal,
  wherein the sigma-delta modulator of the controller has a second or higher order and is configured to provide a first overflow signal and a second overflow signal, and
  wherein the controller is configured to determine the control word based on the first and second overflow signals and based on the accumulated signal.

* * * * *